United States Patent
Zhao et al.

(10) Patent No.: US 10,325,661 B2
(45) Date of Patent: Jun. 18, 2019

(54) METHODS OF PROGRAMMING MEMORY

(71) Applicant: MICRON TECHNOLOGY, INC., Boise, ID (US)

(72) Inventors: Yijie Zhao, Boise, ID (US); Akira Goda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 112 days.

(21) Appl. No.: 15/686,510

(22) Filed: Aug. 25, 2017

(65) Prior Publication Data

US 2017/0358359 A1 Dec. 14, 2017

Related U.S. Application Data

(60) Continuation of application No. 15/248,130, filed on Aug. 26, 2016, now Pat. No. 9,754,671, which is a division of application No. 14/633,287, filed on Feb. 27, 2015, now Pat. No. 9,455,042, which is a continuation of application No. 12/702,948, filed on Feb. 9, 2010, now Pat. No. 8,982,631.

(51) Int. Cl.
| | |
|---|---|
| *G11C 11/34* | (2006.01) |
| *G11C 16/12* | (2006.01) |
| *G11C 16/04* | (2006.01) |
| *G11C 16/10* | (2006.01) |
| *G11C 16/34* | (2006.01) |

(52) U.S. Cl.
CPC .......... *G11C 16/12* (2013.01); *G11C 16/0483* (2013.01); *G11C 16/10* (2013.01); *G11C 16/3427* (2013.01); *G11C 16/3454* (2013.01)

(58) Field of Classification Search
CPC ..... G11C 16/12; G11C 16/0483; G11C 16/10; G11C 16/3427
USPC ................................................ 365/185.19
See application file for complete search history.

(56) References Cited

U.S. PATENT DOCUMENTS

| | | |
|---|---|---|
| 6,975,537 B2 | 12/2005 | Lutze et al. |
| 7,099,193 B2 | 8/2006 | Futatsuyama |
| 7,161,833 B2 | 1/2007 | Hemink |
| 7,292,476 B2 | 11/2007 | Goda et al. |
| 7,468,911 B2 | 12/2008 | Lutze et al. |
| 7,508,711 B2 | 3/2009 | Goda |
| 7,577,026 B2 | 8/2009 | Dong et al. |
| 7,796,430 B2 | 9/2010 | Lutze et al. |
| 7,800,950 B2 | 9/2010 | Park et al. |
| 8,050,090 B2 | 11/2011 | Aritome et al. |
| 8,102,712 B2 | 1/2012 | Goda et al. |
| 8,130,556 B2 | 3/2012 | Lutze et al. |
| 8,189,378 B2 | 5/2012 | Hemink et al. |

(Continued)

*Primary Examiner* — Vu A Le
(74) *Attorney, Agent, or Firm* — Dicke, Billig & Czaja, PLLC

(57) ABSTRACT

Methods of programming a memory include applying a programming voltage on an access line selected for a programming operation of a single page of the memory, applying a second voltage on an access line unselected for the programming operation, increasing the programming voltage for a first plurality of steps of the programming operation, and increasing the second voltage for a second plurality of steps of a first portion of the programming operation, then decreasing the second voltage at a particular point of the programming operation after completing the second plurality of steps and before completing the first plurality of steps.

20 Claims, 4 Drawing Sheets

(56) References Cited

U.S. PATENT DOCUMENTS

| | | | |
|---|---|---|---|
| 8,203,876 B2 | 6/2012 | Goda et al. | |
| 2005/0248989 A1* | 11/2005 | Guterman | G11C 16/30 |
| | | | 365/185.28 |
| 2008/0137426 A1* | 6/2008 | Dong | G11C 16/0483 |
| | | | 365/185.18 |
| 2008/0205147 A1 | 8/2008 | Santin et al. | |
| 2009/0257281 A1* | 10/2009 | Lee | G11C 16/0483 |
| | | | 365/185.19 |
| 2010/0202211 A1 | 8/2010 | Park et al. | |
| 2012/0127800 A1 | 5/2012 | Lutze et al. | |

\* cited by examiner

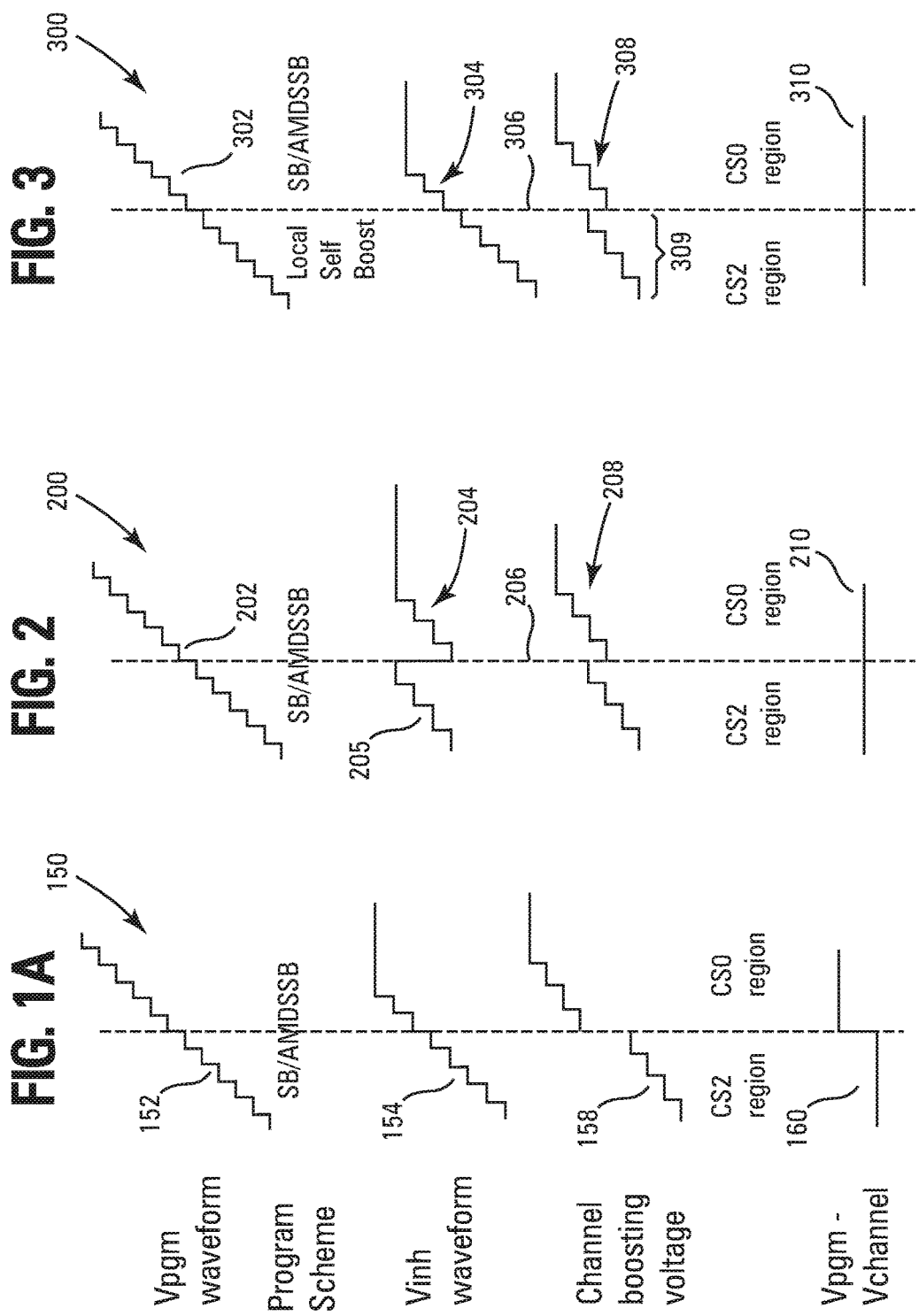

FIG. 4A SB (Self Boost)

FIG. 4B AMDSSB

FIG. 4C LSB (Local Self Boost)

METHODS OF PROGRAMMING MEMORY

RELATED APPLICATIONS

This application is a continuation of U.S. application Ser. No. 15/248,130, filed Aug. 26, 2016 (allowed), which is a divisional of application Ser. No. 14/633,287, filed Feb. 27, 2015 and issued as U.S. Pat. No. 9,455,042 on Sep. 27, 2016, which is a continuation of U.S. application Ser. No. 12/702,948, filed Feb. 9, 2010 and issued as U.S. Pat. No. 8,982,631 on Mar. 17, 2015, which applications are commonly assigned and incorporated entirely herein by reference.

FIELD

The present disclosure relates generally to memory devices and in particular the present disclosure relates to memory devices and methods of programming memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage node (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a data value, e.g., a bit pattern, to a specific threshold voltage (Vt) range stored on the cell. This technology permits the storage of two or more bits of information per cell, depending on the quantity of voltage ranges assigned to the cell and the stability of the assigned voltage ranges during the lifetime operation of the memory cell.

For example, a cell may be assigned four different threshold voltage ranges of 200 mV for each range. Typically, a margin, e.g., a dead space, of 0.2V to 0.4V is between each range to keep the ranges from overlapping. For example, if the threshold voltage of the cell is within the first range, the cell may be assigned a data value having a logical 11 state and is typically considered the erased state of the cell. If the threshold voltage is within the second range, the cell may be assigned a data value having a logical 01 state. This may continue for as many ranges that are used for the cell provided these threshold voltage (Vt) ranges remain stable during the lifetime operation of the memory cell.

Since two or more data values may be assigned to each MLC, the width of each of the threshold voltage ranges for each data value can be very important. The width is related to many variables in the operation of a memory circuit. For example, a cell could be verified at one temperature and read at a different temperature. The circuitry that determines if the cell is erased or programmed to a Vt level within the correct Vt range has to make that determination. That circuitry has some of its characteristics influenced by temperature. A Vt range generally takes into account all of these types of differences to accommodate a shift in the perceived threshold voltage of a memory cell under different operating conditions. In order for the memory cell to operate effectively, the width of the Vt ranges corresponding to the various data values that can be assigned to the memory cell, plus a margin between each Vt range, should amount to the available range of threshold voltages of the memory cell.

Programming in a memory typically is accomplished using a plurality of programming pulses that increase in voltage as programming occurs, with each programming pulse followed by verification to determine whether cells that are being programmed have been programmed to their desired threshold voltages. This is because some cells program at different voltages than other cells. For cells that are not being programmed but are coupled to the same bit line as a cell being programmed, a set of inhibit pulses is applied to their word lines to, for example, reduce coupling effects and over-programming. The inhibit pulses traditionally increase in voltage as programming occurs as well.

In a memory in which the pattern of cells and lines in the memory is such that at low program voltages most of the memory cells on bit lines that are inhibited are adjacent to other memory cells on bit lines that are being programmed, typical errors are more associated with those regions of low program voltages rather than high program voltages as memory cells scale down. This is due in part to the disturb due to increasing Vchannel loss between the pattern where inhibited bit lines have adjacent bit lines connected to memory cells that are being programmed, and the pattern where inhibited bit lines have adjacent bit lines connected to memory cells that are also inhibited from programming.

For reasons such as those stated above, and for other reasons, such as those stated below, which will become apparent to those skilled in the art upon reading and understanding the present specification, there is a need in the art for, among other things, reducing disturbance.

BRIEF DESCRIPTION OF DRAWINGS

FIG. 1A is a graph showing a traditional programming sequence for a memory;

FIG. 2 is a graph showing one programming embodiment for the embodiment of FIG. 1;

FIG. 3 is a graph showing another programming embodiment for the embodiment of FIG. 1;

FIG. 4A is a diagram of a self-boost boosting scheme;

FIG. 4B is a diagram of an AMDSSB boosting scheme;

FIG. 4C is a diagram of a local self-boosting scheme; and

DETAILED DESCRIPTION

Figure 1:
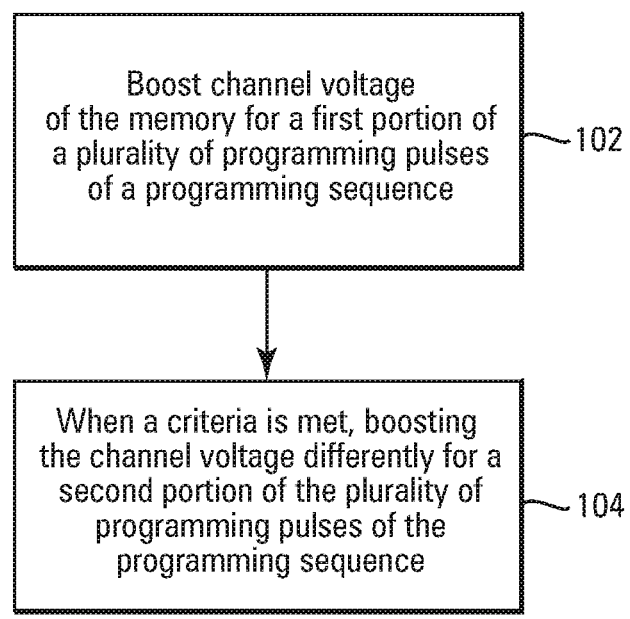
FIG. 1 is a flow chart diagram of a method according to an embodiment of the present disclosure.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

In various embodiments of the present invention, a channel voltage is boosted for a first portion (e.g., number) of programming pulses of a plurality of programming pulses for the memory. Channel voltage is dependent upon the waveform of the inhibit voltage, and the programming scheme used for the memory. When a criteria is met, such as a number of programming pulses, a determined threshold voltage of the cell being programmed, a completion of a determined portion of the programming or completion of programming of a certain program level, or the like, the channel voltage is boosted differently for a second portion of the programming sequence.

Various embodiments for boosting the channel voltage at the transition between the first and second portion of programming pulses include for example using a different boosting scheme for the first portion, or using a different inhibit voltage waveform for the first portion. Such embodiments can provide an improved programming operation in the low program voltage region of a programming sequence to reduce disturb in those regions of the memory where a CS2 pattern is dominant (i.e., a pattern where both bit lines adjacent to an inhibited bit line are not being inhibited from programming). Once a criteria is met, such as a determined threshold voltage reached by the cells being programmed, a certain number of program pulses, or the like, the channel voltage is boosted differently.

Embodiments of the present invention provide various boosting schemes to, for example, reduce program disturb in regions of a memory where a majority of bit lines being inhibited are adjacent to bit lines that are being programmed on both sides. NAND memory is programmed on a page basis. Therefore, a programming bit line is not immediately adjacent to another programming bit line. Traditional programming schemes are configured to reduce disturb issues in a high program voltage region where the dominant pattern is one in which the bit line being inhibited is sandwiched by bit lines that are also inhibited (also referred to as a CS0 pattern). However, as NAND continues to scale downward, memory regions in which the dominant pattern has both bit lines adjacent to the bit line being inhibited are being programmed and are therefore not inhibited (also referred to as a CS2 pattern) are increasingly common, and the raw bit error rates that begin to dominate among total errors in the memory are those associated with that CS2 pattern, since the channel boost voltage (also referred to as Vchannel) loss between the CS2 pattern and the CS0 pattern increases.

Channel boosting schemes can include, for example, boosting the inhibit voltages applied to certain access lines (which are typically referred to as word lines) during a low program voltage portion of a programming sequence, or boosting the channel voltage applied to word lines using a different boosting scheme during a low program voltage portion of a programming sequence.

In one embodiment, a method 100 of programming a memory is shown in FIG. 1. Method 100 comprises boosting a channel voltage to a channel of the memory for a first portion of a plurality of programming pulses of a programming sequence in block 102 and, when a criteria is met, boosting the channel voltage differently for a second portion of the plurality of programming pulses of the programming sequence in block 104. Boosting differently in one embodiment comprises boosting inhibited memory cells to a higher voltage during the first portion of the programming than the second portion of the programming. In one embodiment, the higher voltage to which the inhibited memory cells are boosted is higher than a traditional inhibit pulse voltage for the first portion of programming, and the different boosting for the second portion of programming is a traditional inhibit voltage waveform.

In one embodiment, boosting the channel voltage is accomplished by applying a different inhibit voltage waveform to non-programming cells of a column, as is shown in FIG. 2. For example, during application of a set of inhibit pulses, a voltage of that set of inhibit pulses is boosted during a low program voltage portion of the programming sequence, when the dominant pattern is expected to be the CS2 pattern. That is, the set of inhibit pulses are in one embodiment boosted in voltage for the first portion of the programming sequence to compensate for disturb when a predominant pattern is expected to be one where both of the bit lines adjacent to an inhibited bit line are not inhibited (i.e., the cells coupled to those bit lines are still programming). When a criteria is met, for example the criteria discussed herein, the inhibit voltage waveform is shifted back and the inhibit pulses are applied as in a traditional programming operation. This is in one embodiment done when the CS0 pattern is expected to dominate the array.

A graph 150 showing traditional programming of a memory is shown in FIG. 1A. As can be seen in FIG. 1A, a programming sequence comprising a plurality of programming pulses 152 steps up from a low program voltage to a higher program voltage as the pulse number increases. The program scheme used may be a self-boost or advanced modified drain side self boost (AMDSSB). The inhibit voltage waveform 154 also steps up from a low inhibit voltage to a higher inhibit voltage as the pulse number increases. The channel boosting voltage 158 jumps in a region, designated as the CS0 region, that is, a high program voltage region where the dominant pattern is one in which the bit line being inhibited is sandwiched by bit lines that are also inhibited. Therefore, the difference 160 between the program voltage and the channel voltage is higher in the CS0 region.

A graph 200 showing the programming of the embodiment described in FIG. 1 using a different inhibit voltage waveform is shown in FIG. 2. As can be seen in FIG. 2, a programming sequence comprising a plurality of programming pulses 202 steps up from a low program voltage to a higher program voltage as the pulse number increases. In a region, designated as the CS2 region, when a pattern of both bit lines adjacent to an inhibited bit line not being inhibited is expected to dominate, a set of boosted inhibit pulses 204 is applied to a subset of word lines near the word line being programmed, such as in a scheme as described below. This set of inhibit pulses shown at 205 starts at a higher voltage than the voltage of traditional inhibit pulses as described above, to compensate for Vchannel loss in the regions of the memory where the CS2 pattern is dominant.

The resultant channel voltage is shown at 208. During that portion of the programming sequence when a CS2 pattern is likely dominant, the channel voltage is higher than a traditional channel voltage. This channel voltage, boosted by a higher inhibit voltage, can reduce disturb during that portion of the programming sequence. Traditional programming has the channel voltage lower than that of the present embodiments when a CS2 pattern is likely dominant in the memory, and about the same as that of the present embodiments when a CS0 pattern is likely dominant in the memory, meaning that traditional programming is optimized to reduce disturb errors when a CS0 pattern is likely dominant in the memory. In contrast, one or more of the embodiments of the present disclosure, for example, is configured to further reduce disturb errors when either the CS2 or the CS0 patterns are dominant in the memory.

When a determined criteria is met, as indicated by dashed line 206, the inhibit voltage waveform is shifted back and programming continues with a traditional set of inhibit pulses, leading to a traditional channel voltage. The criteria can be chosen from a number of conditions. The satisfaction of the chosen condition triggers the shifting of the inhibit voltage pulses. Examples of criteria include, but are not limited to, the CS2 pattern dominance moves to CS0 pattern dominance, completion of level 1 programming, that is programming to produce a first shift in data value in the cell, reaching a determined threshold voltage for the cells being programmed, reaching a determined number of program pulses, or the like. The difference 210 between the program voltage and the channel voltage remains substantially constant.

In operation, the embodiment shown in FIG. 2 operates as follows. A method of programming a memory includes applying a programming voltage on a selected word line, and applying an inhibit voltage on unselected word lines. For programming a single page of the memory, the programming voltage is incremented up in a plurality of steps, and the inhibit voltage shifts down at a first point of the single page programming, and then is incremented up after the first point. The first point may be determined by a number of programming cycles having been reached.

In another embodiment, a different boosting scheme is used for a first portion of the plurality of programming pulses, boosting the channel voltage with this different program scheme. A graph 300 showing the programming of an embodiment described in FIG. 1 using different boosting schemes to boost the channel is shown in FIG. 3. As can be seen in FIG. 3, a programming sequence comprising a plurality of programming pulses 302 steps up from a low program voltage to a higher program voltage as the pulse number increases. A set of inhibit pulses 304 also steps up from a low inhibit voltage to a higher inhibit pulse voltage as the pulse number increases. In a region 309, designated as the CS2 region, when a pattern of both bit lines adjacent to an inhibited bit line are not being inhibited is expected to dominate, the channel voltage, which is traditionally lower when the memory is dominated by a CS2 pattern, is boosted to a higher voltage than a traditional channel voltage by using a different boosting scheme. This boosting of channel voltage when the memory is likely to be dominated by a CS2 pattern is done, for example, to compensate for Vchannel loss in that region of the memory when the CS2 pattern is dominant. The channel voltage Vchannel is shown at 308, and indicates a channel voltage that is higher than traditional channel voltages for programming in the CS2 region. This boosted voltage can reduce disturb in that region of the memory during that portion of the programming sequence. Boosting of the channel voltage is accomplished in various embodiments as described below.

As was the case in the first embodiment, when a determined criteria is met, as indicated by dashed line 306, the channel voltage is boosted differently. The criteria can be chosen from a number of conditions. The satisfaction of the chosen condition triggers the boosting scheme change. Examples of criteria include, but are not limited to, the CS2 pattern dominance moves to CS0 pattern dominance, completion of level 1 programming, that is programming to level 1, reaching a determined threshold voltage for the cells being programmed, reaching a determined number of program pulses, or the like. The difference 310 between the program voltage and the channel voltage remains substantially constant.

In operation, the embodiment shown in FIG. 3 operates as follows. A method of programming a memory according to the embodiment of FIG. 3 includes applying a programming voltage on a selected word line, applying an inhibit voltage on unselected word lines, and applying an isolation voltage on the unselected word lines. A different boosting scheme is applied before a first point in the programming and after the first point in the programming. The first point may be determined by a number of programming cycles having been reached.

Figures 4A, 4B, 4C:
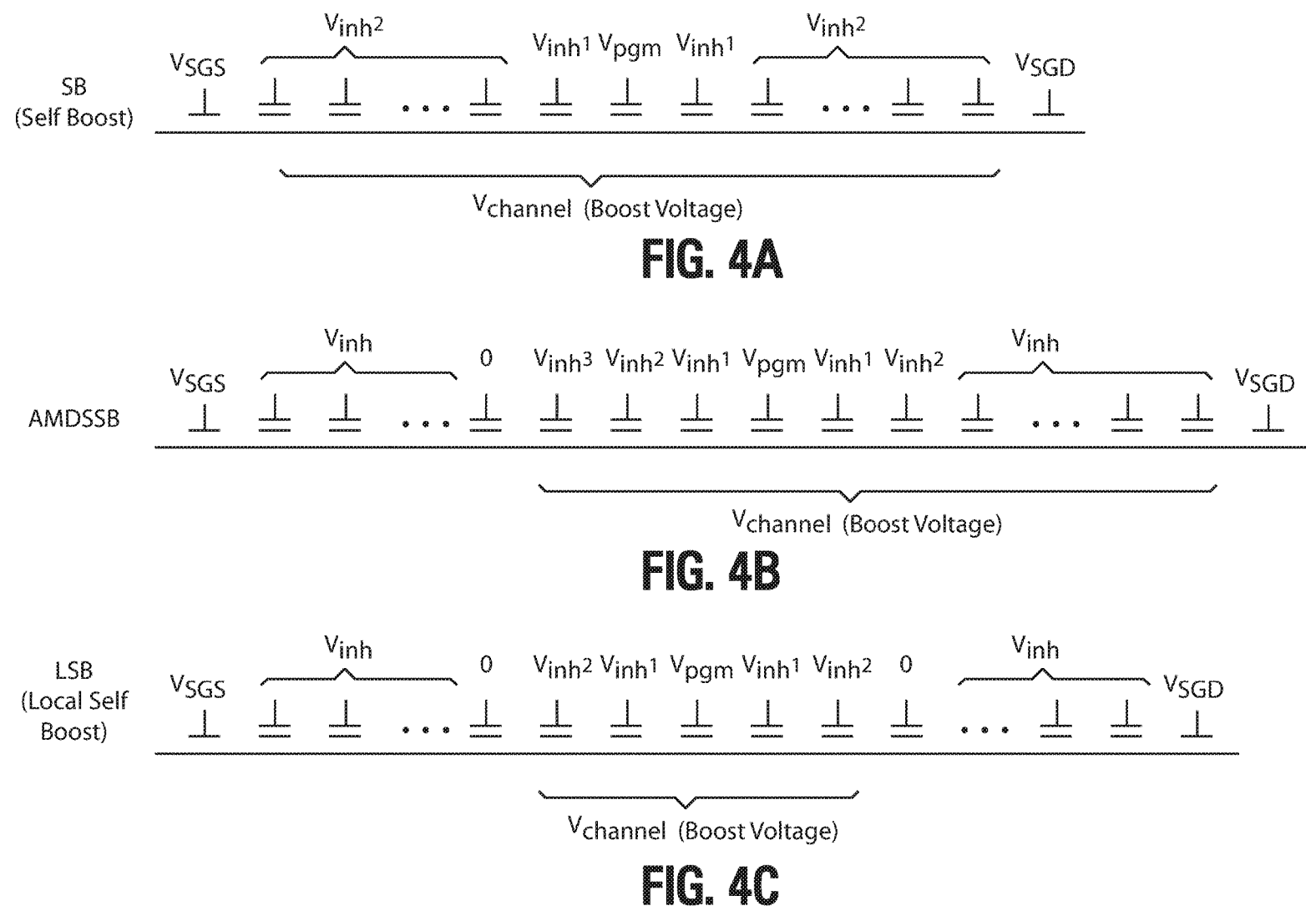

Embodiments of various boosting schemes are shown in FIGS. 4A, 4B, and 4C. The boosting schemes of FIGS. 4A and 4B are used traditionally in programming memories. For example, as shown in FIG. 4A, a conventional self-boost scheme boosts all (typically 64) word lines which boosts the channel voltage. Self-boost is typically configured to more efficiently program during portions when the CS0 pattern dominates.

FIG. 4B shows an advanced modified drain side self boost (AMDSSB) boosting scheme. Such a scheme may be used for programming in the CS0 region in the embodiments shown and described, for example, in FIGS. 2 and 3. AMDSSB only boosts voltage to the channels corresponding to word lines near a word line being programmed as well as all channels corresponding to word lines between the programming word line and a drain side select gate, typically many more word lines than in a local self boosting scheme as described below. AMDSSB boosting is described in greater detail in U.S. Published Patent Application 20080225589, commonly owned by the owner of the present application.

FIG. 4C shows a local self-boosting scheme. Such a scheme may be used for programming in the CS2 region, prior to the criteria being met, in embodiments such as that shown and described, for example, in FIG. 3. This scheme boosts only a portion of the channels in a column by boosting typically on the order of about five to seven word lines, including the channel corresponding to the word line being programmed and the channels of approximately two to three adjacent word lines on each side of the word line being programmed. Further, in a local self boosting scheme, word lines adjacent the word lines used for the local self boost may be grounded.

While a channel voltage is shown herein as being boosted before the criteria is met, it should be understood that channel voltages are affected by inhibit voltage waveforms and programming schemes, and a channel voltage could be developed that is boosted higher than a traditional channel voltage and then shifted back after the criteria is met without departing from the scope of the disclosure.

Figure 5:
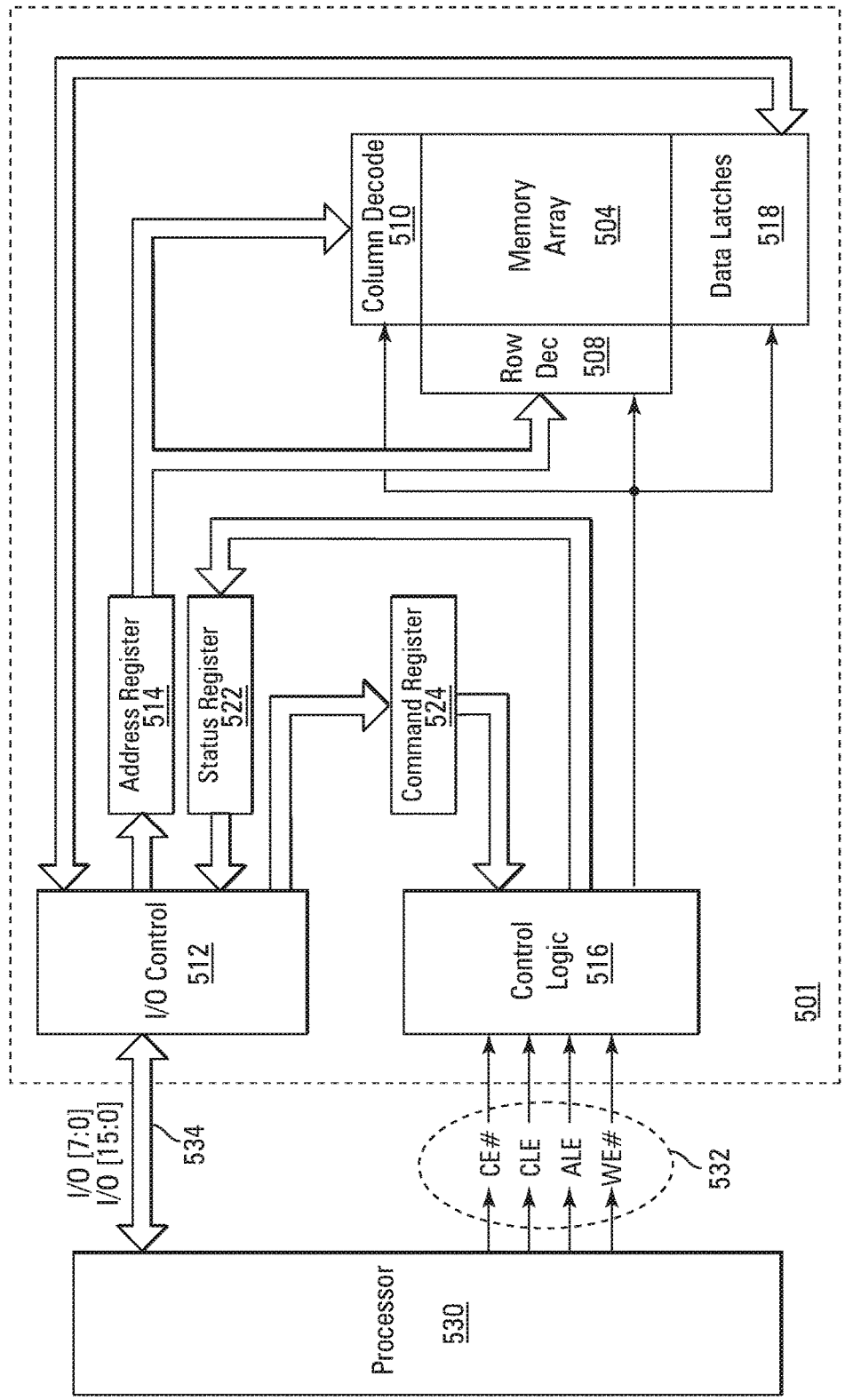
FIG. 5 is a functional block diagram of a system according to an embodiment of the present disclosure.

FIG. 5 is a simplified block diagram of a memory device 501 according to an embodiment of the disclosure, and on which various embodiments of the disclosure can be practiced. Memory device 501 includes an array of memory cells 504 arranged in rows and columns. In general, however, the embodiments described herein are adaptable to any array architecture permitting generation of a data signal indicative of the threshold voltage of each memory cell.

A row decode circuitry 508 and a column decode circuitry 510 are provided to decode address signals provided to the memory device 501. Address signals are received and decoded to access memory array 504. Memory device 501 also includes input/output (I/O) control circuitry 512 to manage input of commands, addresses and data to the memory device 501 as well as output of data and status information from the memory device 501. An address register 514 is coupled between I/O control circuitry 512 and row decode circuitry 508 and column decode circuitry 510 to latch the address signals prior to decoding. A command register 524 is coupled between I/O control circuitry 512 and control logic 516 to latch incoming commands. Control logic 516 controls access to the memory array 504 in response to the commands and generates status information for the external processor 530. The control logic 516 is coupled to row decode circuitry 508 and column decode circuitry 510 to control the row decode circuitry 508 and column decode circuitry 510 in response to the addresses.

Control logic 516 can be coupled to a sample and hold circuitry 518. The sample and hold circuitry 518 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 518 may further provide for amplification and/or buffering of the sampled data to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 512 for output from the memory device, in the case of a read operation, or used for comparison during one or more verify operations in programming the memory device. It is noted that the I/O control circuitry 512 could optionally include analog-to-digital conversion functionality and digital-to-analog conversion (DAC) functionality to convert read data from an analog data signal to a digital bit pattern and to convert write data from a digital bit pattern to an analog signal such that the memory device 501 could be adapted for communication with either an analog or digital data interface.

During a write operation, target memory cells of the memory array 504 are programmed until voltages indicative of their Vt levels match the levels held in the sample and hold circuitry 518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 518 for transfer to an external processor (not shown in FIG. 5) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 518 may include caching, i.e., multiple storage locations for each data value, such that the memory device 501 may be reading a next data value while passing a first data value to the external processor, or receiving a next data value while writing a first data value to the memory array 504. A status register 522 is coupled between I/O control circuitry 512 and control logic 516 to latch the status information for output to the external processor.

Memory device 501 receives control signals at control logic 516 over a control link 532. The control signals may include a chip enable CE#, a command latch enable CLE, an address latch enable ALE, and a write enable WE#. Memory device 501 may receive commands (in the form of command signals), addresses (in the form of address signals), and data (in the form of data signals) from an external processor over a multiplexed input/output (I/O) bus 534 and output data to the external processor over I/O bus 534.

In a specific example, commands are received over input/output (I/O) pins [7:0] of I/O bus 534 at I/O control circuitry 512 and are written into command register 524. The addresses are received over input/output (I/O) pins [7:0] of bus 534 at I/O control circuitry 512 and are written into address register 514. The data may be received over input/ output (I/O) pins [7:0] for a device capable of receiving eight parallel signals, or input/output (I/O) pins [15:0] for a device capable of receiving sixteen parallel signals, at I/O control circuitry 512 and are transferred to sample and hold circuitry 518. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 5 has been simplified to help focus on the embodiments of the disclosure. Additionally, while the memory device of FIG. 5 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 534. Because the data signals represent bit patterns instead of individual bits, serial communication of an 8-bit data signal could be as efficient as parallel communication of eight signals representing individual bits.

A program function on selected cells, blocks, pages, or the like of the memory 400 is performed as described above with respect to FIGS. 1-3.

Programming methods and memories using those programming methods have been shown that include boosting a channel voltage when a CS2 pattern is expected to be dominant (i.e., a pattern where both bit lines adjacent to an inhibited bit line are not inhibited), such as to reduce disturb errors when such a patterns is dominant.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a memory, comprising:
    applying a programming voltage on an access line selected for a programming operation of a single page of the memory;
    applying a second voltage on an access line unselected for the programming operation;
    increasing the programming voltage for a first plurality of steps of the programming operation; and
    increasing the second voltage for a second plurality of steps of a first portion of the programming operation, then decreasing the second voltage at a particular point of the programming operation after completing the second plurality of steps and before completing the first plurality of steps.

2. The method of claim 1, further comprising returning to increasing the second voltage during a second portion of the programming operation.

3. The method of claim 2, wherein returning to increasing the second voltage comprises returning to increasing the second voltage for a third plurality of steps of the programming operation.

4. The method of claim 1, wherein the particular point is determined by a number of programming cycles having been reached.

5. The method of claim 1, wherein the particular point is determined by completion of programming for a certain programming level.

6. The method of claim 1, wherein the particular point is determined by a shift in pattern of a plurality of bit lines coupled to memory cells of the access line selected for programming from a first pattern, where both bit lines adjacent to a bit line inhibited from programming are not being inhibited from programming, being dominant, to a second pattern, where both bit lines adjacent to a bit line inhibited from programming are being inhibited from programming, being dominant.

7. The method of claim 1, wherein the particular point is determined by reaching a determined threshold voltage for memory cells of the selected access line being programmed.

8. The method of claim 1, wherein the particular point is determined by reaching a particular number of steps of the first plurality of steps.

9. A method of programming a memory, comprising:
    applying a programming voltage on an access line selected for a programming operation of a single page of the memory;
    applying a second voltage on an access line unselected for the programming operation;
    developing a boosted channel voltage while applying the programming voltage and applying the second voltage, wherein the programming voltage is expected to increase a threshold voltage of a memory cell of the selected access line having the boosted channel voltage, and wherein the second voltage is expected to inhibit an increase of a threshold voltage of a memory cell of the unselected access line having the boosted channel voltage;
    increasing the programming voltage for a first plurality of steps of the programming operation; and
    increasing the second voltage for a second plurality of steps during a first portion of the programming operation, then decreasing the second voltage at a particular point of the programming operation after completing the second plurality of steps and before completing the first plurality of steps.

10. The method of claim 9, wherein developing the boosted channel voltage comprises developing the boosted channel voltage for the memory cell of the selected access line and for memory cells of a plurality of access lines unselected for the programming operation.

11. The method of claim 10, wherein developing the boosted channel voltage for the memory cell of the selected access line and for the memory cells of the plurality of access lines unselected for the programming operation comprises developing the boosted channel voltage for each memory cell connected in series with the memory cell of the selected access line.

12. The method of claim 11, wherein developing the boosted channel voltage for the memory cell of the selected access line and for the memory cells of the plurality of access lines unselected for the programming operation further comprises developing the boosted channel voltage for each memory cell connected in series with the memory cell of the selected access line prior to the particular point of the programming operation, and developing the boosted channel voltage for less than all memory cells connected in series with the memory cell of the selected access line after the particular point of the programming operation.

13. The method of claim 10, wherein developing the boosted channel voltage for the memory cell of the selected access line and for the memory cells of the plurality of access lines unselected for the programming operation comprises developing the boosted channel voltage for less than all memory cells connected in series with the memory cell of the selected access line.

14. The method of claim 9, further comprising returning to increasing the second voltage during a second portion of the programming operation.

15. The method of claim 14, wherein returning to increasing the second voltage during the second portion of the programming operation comprises returning to increasing the second voltage during the second portion of the programming operation less than a remaining portion of the programming operation.

16. The method of claim 14, wherein returning to increasing the second voltage comprises returning to increasing the second voltage for a third plurality of steps of the programming operation.

17. The method of claim 9, wherein the particular point is determined by a criterion selected from a group consisting of a number of programming cycles having been reached, completion of programming for a particular programming level, a shift from a CS2 pattern dominating to a CS0 pattern dominating, reaching a determined threshold voltage for memory cells of the selected access line being programmed, and reaching a particular number of steps of the first plurality of steps.

18. A method of programming a memory, comprising:
applying a programming voltage on an access line selected for a programming operation of a single page of the memory, the selected access line having a memory cell selected for the programming operation;
applying a second voltage on an access line unselected for the programming operation, the unselected access line having a memory cell unselected for the programming operation, wherein the selected memory cell and the unselected memory cell are connected in series;
developing a boosted channel voltage of the selected memory cell and the unselected memory cell while applying the programming voltage and applying the second voltage, wherein the programming voltage is expected to increase a threshold voltage of the selected memory cell, and wherein the second voltage is expected to inhibit an increase of a threshold voltage of the unselected memory cell;
increasing the programming voltage for a first plurality of steps of the programming operation; and
increasing the second voltage for a second plurality of steps during a first portion of the programming operation, then decreasing the second voltage at a particular point of the programming operation after completing the second plurality of steps and before completing the first plurality of steps.

19. The method of claim 18, wherein decreasing the second voltage at the particular point of the programming operation comprises decreasing the second voltage to an initial voltage level of the second voltage.

20. The method of claim 18, further comprising returning to increasing the second voltage for a third plurality of steps during a second portion of the programming operation after decreasing the second voltage at the particular point of the programming operation, wherein a number of steps of the second plurality of steps plus a number of steps of the third plurality of steps is less than a number of steps of the first plurality of steps.

* * * * *